United States Patent
Lalo et al.

(10) Patent No.: US 10,268,942 B2
(45) Date of Patent: Apr. 23, 2019

(54) PACKAGED ELECTRONIC MODULE AND MANUFACTURING METHOD THEREOF

(71) Applicants: Cyril Lalo, Los Angeles, CA (US); Sebastien Pochic, Schaerbeek (BE); Jacques Essebag, Paris (FR)

(72) Inventors: Cyril Lalo, Los Angeles, CA (US); Sebastien Pochic, Schaerbeek (BE); Jacques Essebag, Paris (FR)

( * ) Notice: Subject to any disclaimer, the term of this patent is extended or adjusted under 35 U.S.C. 154(b) by 0 days.

(21) Appl. No.: 15/645,234

(22) Filed: Jul. 10, 2017

(65) Prior Publication Data

US 2019/0012588 A1   Jan. 10, 2019

(51) Int. Cl.
*G06K 19/04* (2006.01)
*H01L 21/48* (2006.01)
*H01L 23/14* (2006.01)
*H01L 23/58* (2006.01)
*H01L 23/66* (2006.01)
*G06K 19/077* (2006.01)
*H01L 23/498* (2006.01)

(52) U.S. Cl.
CPC .... *G06K 19/07722* (2013.01); *H01L 21/4853* (2013.01); *H01L 23/145* (2013.01); *H01L 23/49855* (2013.01); *H01L 23/58* (2013.01); *H01L 23/66* (2013.01); *G06K 19/042* (2013.01); *G06K 19/0775* (2013.01); *G06K 19/07707* (2013.01); *G06K 19/07747* (2013.01); *H01L 2223/6677* (2013.01)

(58) Field of Classification Search
None
See application file for complete search history.

(56) References Cited

U.S. PATENT DOCUMENTS

2017/0132507 A1* 5/2017 Blythe ............. G06K 19/07745

* cited by examiner

*Primary Examiner* — Kristy A Haupt
(74) *Attorney, Agent, or Firm* — Michael N Cohen; Cohen IP Law Group PC (57) ABSTRACT

The present invention is a packaged electronic module with embedded electronics for use in smart cards. This invention assembles a plurality of electronics components on a flexible printed circuit, together with an integrated circuit chip and a contact plate, into a module. This module can then be embedded into a plastic card, using regular milling techniques, by a card manufacturer. This method packages the plurality of electronics components into a module. The present invention provides a business with the capability to avoid additional capital expenditure required for special equipment and enables all existing card manufacturers to manufacture smart cards with embedded electronics.

23 Claims, 7 Drawing Sheets

PACKAGED ELECTRONIC MODULE AND MANUFACTURING METHOD THEREOF

BACKGROUND OF THE DISCLOSURE

Technical Field of the Disclosure

This invention relates to electronic modules, and more particularly to a packaged electronic module with embedded electronics for use in smart cards.

Description of the Related Art

Semiconductor technology has made tremendous progress in the last few decades. Contactless smart cards are currently used widely in many fields like transport sector and banking sector for identifying persons as well as objects. Smart Cards, also known as chip cards and IC cards, are plastic that contain one or more semiconductor chips. In most of the applications, the smart cards are contactless which means that the cards perform data transfer using radio frequency (RF) technology between the card and a receiver/transmitter. Additionally, dual interface cards can have both capabilities using a single chip module. In general, many different fields of application arise for smart cards or integrated circuit cards, for example in the field of personal identification (identity cards, access cards, authorization cards), in the field of data encryption (code cards), for personal use (bank smart cards, payment cards) and in similar fields.

Along with the progress of electronic industries, electronic products are developed toward the trend of miniaturization and multi-function. Accordingly, various package types have been developed. Electronic packaging refers to the packaging of the integrated circuit chips or dies. The materials play an important role in electronic packaging, most of the work on electronic packaging is concerned with packaging scheme rather than materials. The conventional approach to electronic packaging and interconnect has been to package individual integrated circuit (IC) chips into a single package and to attach these packages to a printed circuit board to provide interconnect between the individual IC chips.

Another approach describes a double-sided electronic module of a hybrid contact-contactless smart card designed to be lodged in a cavity of the card, where the cards are incorporated in a blank with a special manufacturing format. Said device comprises a unit for depositing and pre-gluing a protective layer on at least one blank, a laminating unit comprising means for pressing, heating and cooling at least one blank and a unit for cutting the blank into a smart card. The pressing, heating and cooling means comprise two supports placed opposite each other and displaceable towards each other in order to apply pressure on the said blank. Each support comprises at least one ceramic heating and cooling device comprising a stack made up of a ceramic block and a metal laminating plate. However, this method has high chance of damaging the components since there is hot or cold lamination step included. Moreover, additional capital expenditure and special equipment are required for laminating.

Another approach describes an integrated circuit (IC) film with a conventional packaging step, and, in particular, it need not be covered with any package molding material. The IC chip is directly mounted on a flexible printed circuit (FPC) board. The IC chip is disposed on the FPC board, and is bonded to leads of the FPC board and thus electrically connected thereto. Also, a flexible plastic substrate is needed to mount the components into the FPC, thus increases the cost of the FPC. Moreover, additional operations such as pre-lamination and lamination operations are required before the IC chip is embedded.

Yet another approach describes a method for producing a smart card module, the arrangement includes arranging a smart card module on a first carrier layer, wherein the first carrier layer is free of a prefabricated smart card module receptacle cutout for receiving the smart card module, wherein the first carrier layer may include plastic (a polymer). The smart card module includes a substrate, a chip on the substrate, a first mechanical reinforcement structure between the chip and the substrate. The smart card module can be embedded between the first carrier layer and the second carrier layer. The embedding of the smart card module can be carried out, for example, by means of lamination, e.g. by means of cold lamination or hot lamination, or by means of lamination and additional pressing. Additionally, the embedding of the smart card module can be carried out by means of pressing. The substrate (or the carrier) for providing a smart card module can be formed from a flexible material, e.g. a plastic or polymer, and/or have a corresponding thickness, with the result that the substrate is flexible. However, this method does not include embedded electronics. Also, this method of manufacturing cards by laminating is hard to do and only a limited number of card manufacturers are capable of doing it correctly.

Therefore, there is a need for an efficient electronic packaging module and a manufacturing method thereof. This method would assemble all the required electronics into a module instead of onto a Flexible Printed Circuit (FPC). The cost of the module would be lower than that of an FPC. Such a method would not need a flexible plastic substrate to mount the components. Further, it would not include any lamination step, thus reducing the risk of damaging the components. Thus, it would provide a business with the capability to avoid additional capital expenditure required for special equipment. Such a needed method would decrease the unit cost of a packaging chip. This embodiment would enable all existing card manufacturers to manufacture smart cards with embedded electronics. The present embodiment overcomes shortcomings in this area by accomplishing these critical objectives.

SUMMARY OF THE DISCLOSURE

To minimize the limitations found in the prior art, and to minimize other limitations that will be apparent upon the reading of the specification, the present invention is a packaged electronic module with embedded electronics for use in smart cards. This invention is a new type of packaged electronic module that is used to manufacture value-add smart cards with embedded electronics. The present packaged electronic module packages all the electronics components usually found on a flexible printed circuit (FPC), together with an integrated circuit chip and a contact plate, into a module. This module can then be embedded into a plastic card, using regular milling techniques, by a card manufacturer.

The present invention provides an efficient electronic packaging module and a manufacturing method thereof. This method assembles all required electronics components into a module instead of onto a flexible printed circuit (FPC). The present invention provides a business with the capability to avoid additional capital expenditure required for special equipment. Also, the present invention decreases the unit cost of a packaging chip and enables all existing card manufacturers to manufacture smart cards with embedded electronics.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

Elements in the figures have not necessarily been drawn to scale in order to enhance their clarity and improve understanding of these various elements and embodiments of the invention. Furthermore, elements that are known to be common and well understood to those in the industry are not depicted in order to provide a clear view of the various embodiments of the invention, thus the drawings are generalized in form in the interest of clarity and conciseness.

DETAILED DESCRIPTION OF THE PREFERRED EMBODIMENT

In the following discussion that addresses a number of embodiments and applications of the present invention, reference is made to the accompanying drawings that form a part hereof, and in which is shown by way of illustrating specific embodiments in which the invention may be practiced. It is to be understood that other embodiments may be utilized and changes may be made without departing from the scope of the present invention.

Various inventive features are described below that can each be used independently of one another or in combination with other features. However, any single inventive feature may not address any of the problems discussed above or only address one of the problems discussed above. Further, one or more of the problems discussed above may not be fully addressed by any of the features described below. The invention will now be described with reference to the accompanying drawing which does not limit the scope and the ambit of the invention. In the following discussion that addresses a number of embodiments and applications of the present invention, reference is made to the accompanying drawings that form a part hereof, and in which is shown by way of illustrating specific embodiments in which the invention may be practiced. It is to be understood that other embodiments may be utilized and changes may be made without departing from the scope of the present invention.

Figure 1:
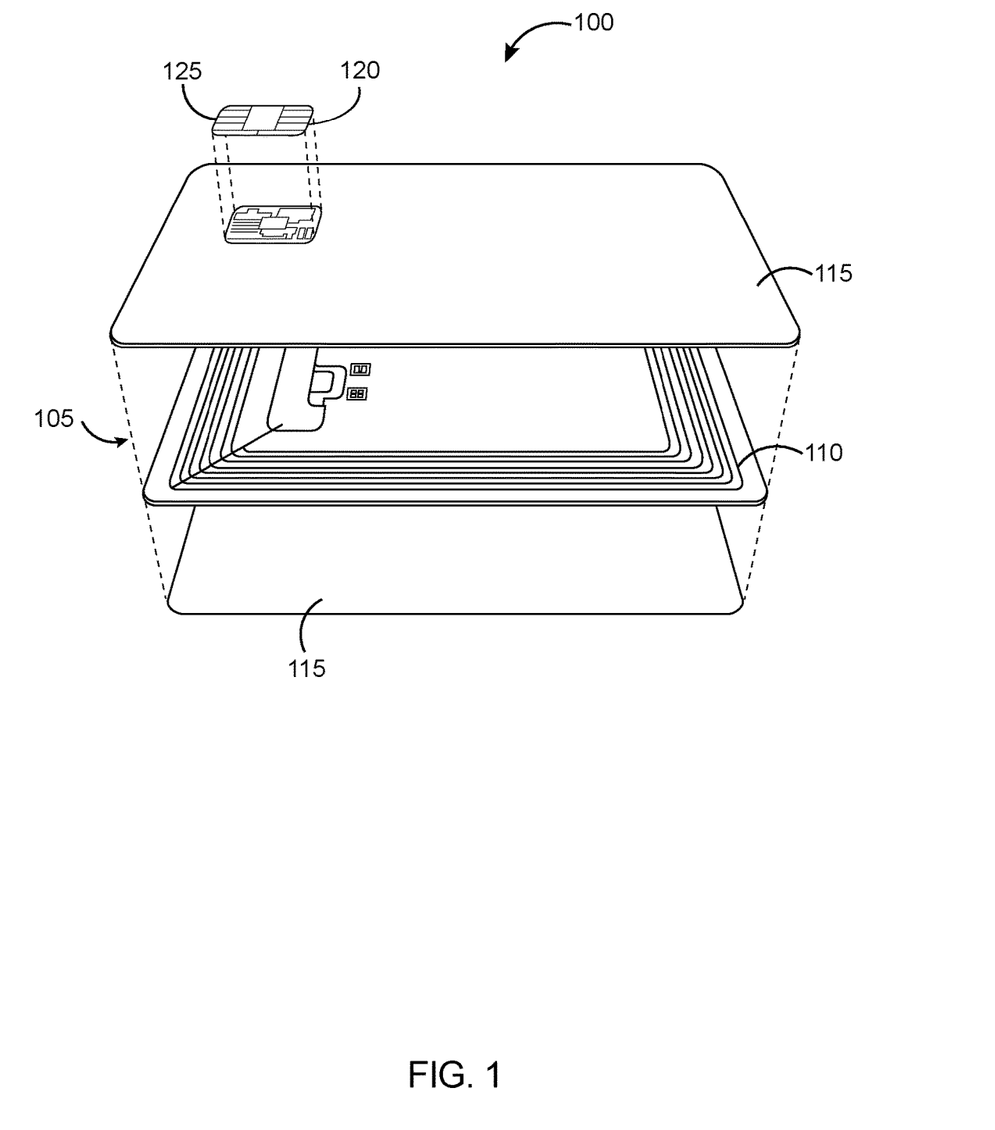
FIG. 1 represents an exploded perspective view of a smart card in accordance with the preferred embodiment of the present invention.

Turning first to FIG. 1, an exploded perspective view of a value-add smart card 100 in accordance with the preferred embodiment of the present invention is illustrated. A value-add smart card 100 comprises a card body 105, a plurality of plastic card layers 115 and a packaged electronic module 120, and may also comprise a card antenna 110, or an embedded battery (not shown). The packaged electronic module 120 further comprising an integrated circuit chip (not shown) coupled to a contact plate 125. The packaged electronic module 120 is embedded in the card body 105. The packaged electronic module 120 could also be connected to an antenna 110 or an embedded battery (not shown), inside the card body. The value-add smart card 100 may be contactless-only, contact-only, or may be dual-interface (contact and contactless). The card body 105 can be plain, having different layers of plastic or other materials, one or more of the layers could have an antenna or an embedded battery (not shown), etc. The packaged electronic module 120 for the value-add smart card 100 further comprises microcontrollers or other chips (not shown), an electronic display (not shown), passive components such as resistors and capacitors (not shown), connectors such as external connectors to optionally connect the module to the smart card.

Figure 2:
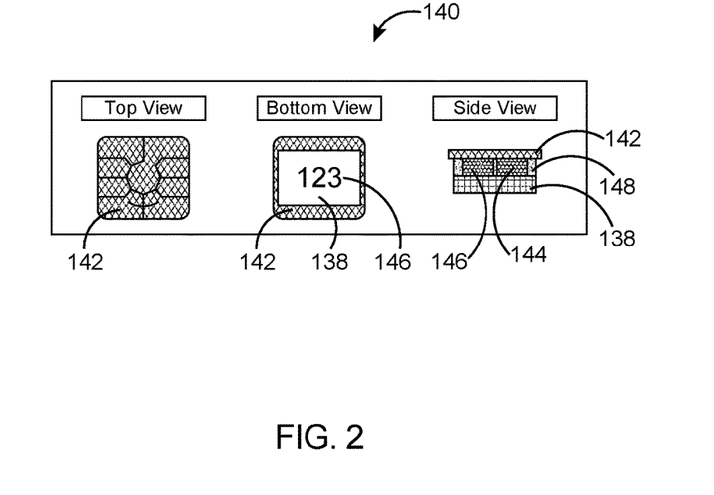
FIG. 2 represents a first assembly of a packaged electronic module in accordance with the preferred embodiment of the present invention.

FIG. 2 illustrates a first assembly of the packaged electronic module 140 in accordance with the preferred embodiment of the present invention. The first assembly 140 comprises an all-in-one assembly where the footprint of all the electronics components is not larger than that of a contact plate 142. The first assembly of the packaged electronic module 140 comprises the contact plate 142 connected to an integrated circuit chip 144, a plurality of electronic components 146 connected to the contact plate 142 and the integrated circuit chip 144, an electronic display 138 connected to the plurality of electronic components 146 and a plurality of connectors (not shown) that may connect the packaged electronic module 140 to the card antenna 110 (shown in FIG. 1) or an embedded battery (not shown). The thickness of the packaged electronic module 140 is equal or smaller to that of the plastic card. The packaged electronic module 140 may have a micro-antenna to connect to an antenna in the card using inductive coupling. The electronic display 138 may be replaced by a value-add component, such as a fingerprint sensor, LEDs, an electronic or mechanical button.

Figure 2A:
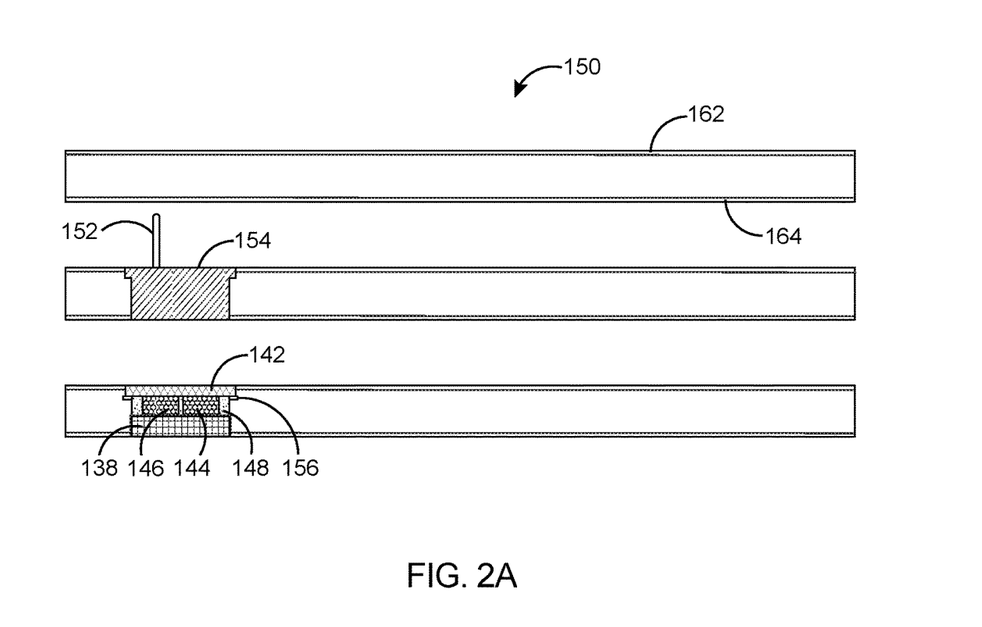
FIGS. 2A-2B are schematic diagrams showing an embedding of the first assembly shown in FIG. 2 in accordance with the preferred embodiment of the present invention.
Figure 2B:
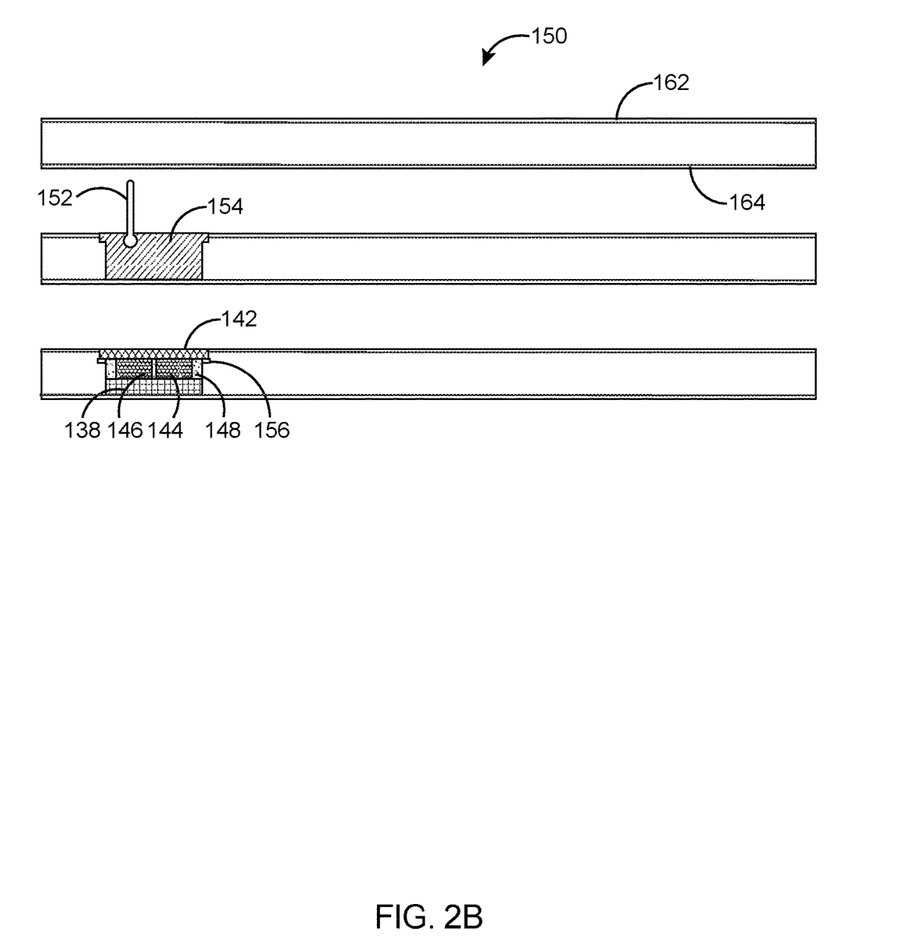

FIGS. 2A-2B are schematic diagrams showing an embedding of the first assembly shown in FIG. 2 according to the present invention. A method of fabrication of a value-add smart card 100 (shown in FIG. 1) comprising the step of embedding the all-in-one assembly of the first assembly 140, by milling a card 150 from the front of the card all the way through the back of the card and embedding the packaged electronic module 140 from the front of the card. The method of fabrication of a value-add smart card 100 (shown in FIG. 1) further comprising the step of milling a card 150 from the front of the card to the back protective overlay 164, but leaving the protective overlay 164 intact, which should be transparent if for example 138 is an electronic display, and embedding the packaged electronic module 140 from the front of the card. In this case the thickness of the packaged electronic module 140 will be equal to that of the card minus the thickness of that back protective layer. The milled area 154 should conform to the shape of the packaged electronic module 140.

Figure 3:
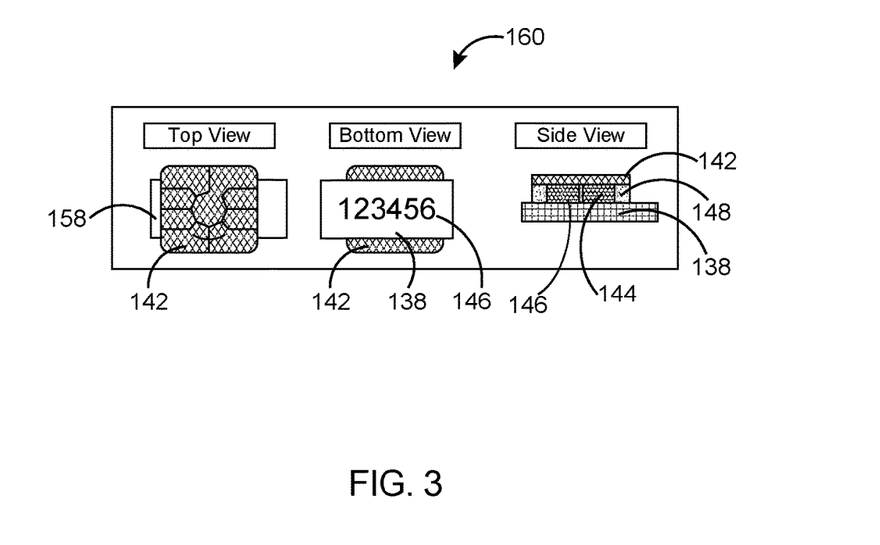
FIG. 3 represents a second assembly of a packaged electronic module in accordance with the preferred embodiment of the present invention.

FIG. 3 represents the second assembly of the packaged electronic module in accordance with the preferred embodiment of the present invention. The second assembly 160 comprises an all-in-one assembly where the footprint of the electronics 158 is larger than that of the contact plate 142. The second assembly of a packaged electronic module 160 comprises the contact plate 142 connected to the integrated circuit chip 144, the plurality of electronic components 146 connected to the contact plate 142 and the integrated circuit chip 144, an electronic display 138 connected to the plurality of electronic components 146 and the plurality of connectors (not shown) that may connect the packaged electronic module 160 to the card antenna 110 (shown in FIG. 1) or an embedded battery (not shown). The thickness of the packaged electronic module 160 is equal or smaller to that of the smart card. Depending on the size of the electronic components 146, the module could have an asymmetric shape to avoid that some electronic components would be too close to the card's border. The packaged electronic module 160 may have a micro-antenna to connect to an antenna in the card using inductive coupling. The electronic display 138 may be a value-add component, such as a fingerprint sensor, LEDs, an electronic or mechanical button.

Figure 3A:
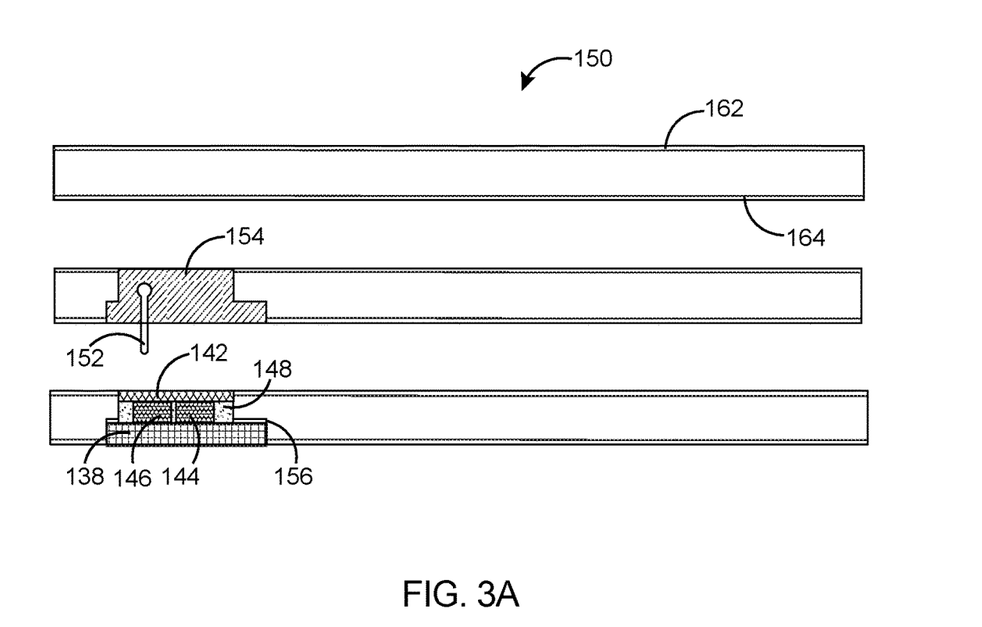
FIG. 3A is a schematic diagram showing an embedding of the second assembly shown in FIG. 3 according to the present invention.

FIG. 3A is a schematic diagram showing an embedding of the second assembly shown in FIG. 3 according to the present invention. The method of fabrication of a value-add smart card 100 (shown in FIG. 1) comprising the step of embedding the all-in-one assembly of a second assembly 160, by milling the smart card from the back of the card all the way through the front of the card and embedding the module from the back of the card since the back of the second assembly 160 is larger than the front. The milled area 154 is larger on the back of the card than the front the card to conform to the shape of the packaged electronic module 160.

Figure 4:
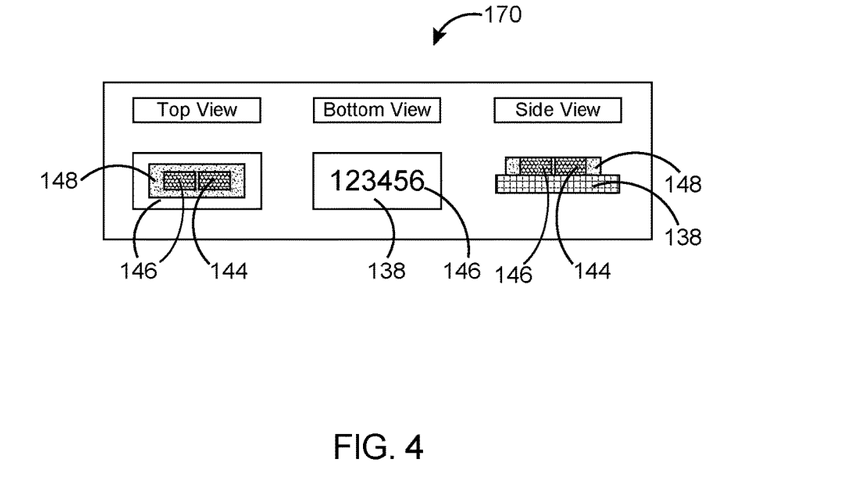
FIG. 4 represents a third assembly of a packaged electronic module in accordance with the preferred embodiment of the present invention.

FIG. 4 represents a third assembly of the packaged electronic module in accordance with the preferred embodiment of the present invention. The third assembly of the packaged electronic module 170 comprises the integrated circuit chip 144, the plurality of electronic components 146, the electronic display 138 connected to the plurality of electronic components 146 and the plurality of connectors (not shown) that may connect the packaged electronic module 170 to the card antenna 110 (shown in FIG. 1) or an embedded battery (not shown). The thickness of packaged electronic module 170 is not larger than that of the plastic card. Depending on the size of the electronic components 146, the module could have an asymmetric shape to avoid that some electronic components would be too close to the card's border. The third assembly does not have a contact plate so it can be used for contactless-only cards, one-time-password cards, or other value-add cards that do not require a contact plate to function. The packaged electronic module may have a micro-antenna to connect to an antenna in the card using inductive coupling. The electronic display 138 may be a value-add component, such as a fingerprint sensor, LEDs, an electronic or mechanical button.

Figure 4A:
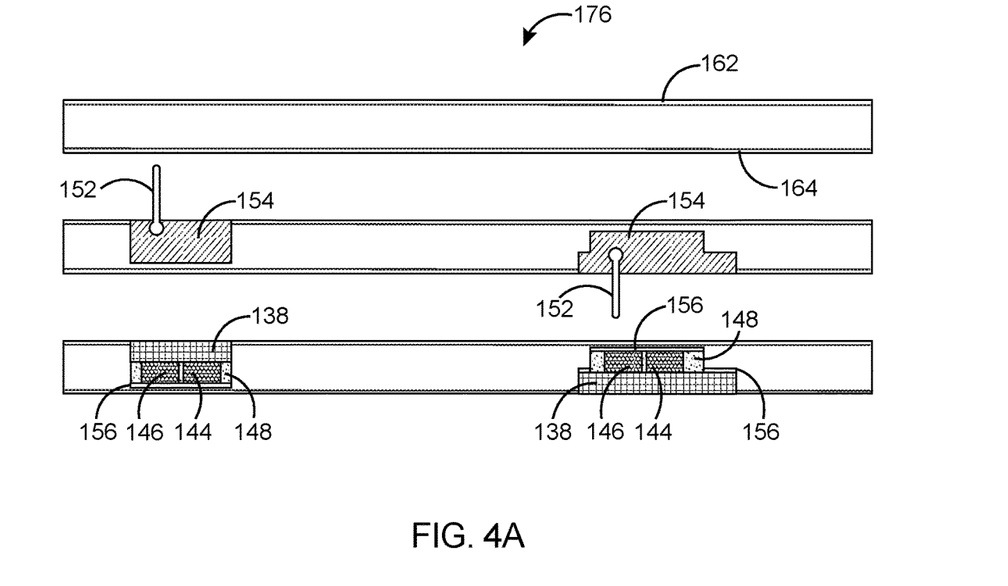
FIG. 4A is a schematic diagram showing an embedding of the third assembly shown in FIG. 4 according to the present invention.

FIG. 4A is a schematic diagram showing an embedding of the third assembly shown in FIG. 4, according to the present invention. The method of fabrication of a value-add smart card 100 (shown in FIG. 1) comprising the step of embedding the third assembly of the packaged electronic module 170, by milling the card either from the back or the front of the card, and embedding the packaged electronic module 170. Since the packaged electronic module 170 does not have the contact plate 142, it can virtually be embedded anywhere on the card. The milled area 154 should conform to the shape of the packaged electronic module 170.

Figure 5:
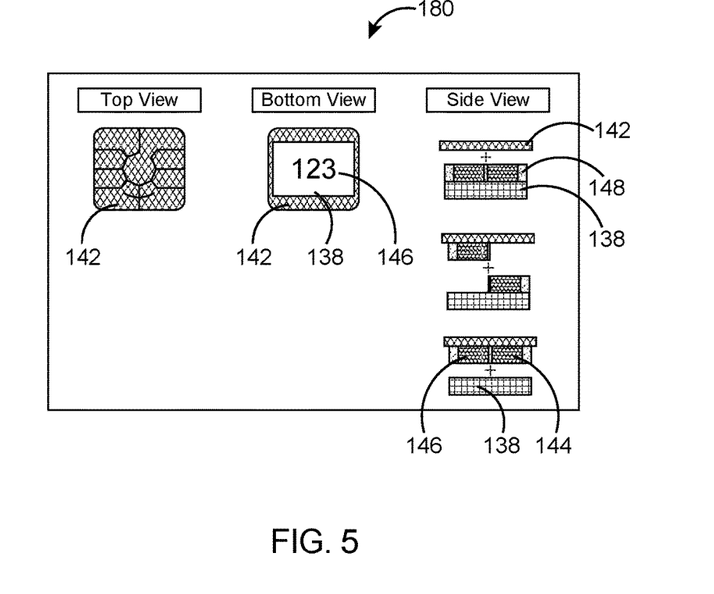
FIG. 5 represents a fourth assembly of a packaged electronic module in accordance with the preferred embodiment of the present invention.

FIG. 5 represents a fourth assembly of a packaged electronic module in accordance with the preferred embodiment of the present invention. The fourth assembly 180 comprises a two-part assembly where the footprint of all the electronics is not larger than that of the contact plate 142. The fourth assembly of the packaged electronic module 180 comprises the plurality of electronic components 146 connected to the contact plate 142 and the integrated circuit chip 144, the electronic display 138 connected to the plurality of electronic components 146 and the plurality of connectors (not shown) that may connect the packaged electronic module 180 to the card antenna 110 (shown in FIG. 1) or an embedded battery (not shown). The thickness of the packaged electronic module 180 may be equal to but not larger than that of the plastic card. The fourth assembly 180 may be further defined as an assembly of the top half portion and the bottom half portion of the packaged electronic module. The fourth assembly 180 wherein the top half portion and the bottom half portion is assembled into an asymmetric packaged electronic module. The packaged electronic module 180 may have a micro-antenna to connect to an antenna in the card using inductive coupling. The electronic display 138 may be a value-add component, such as a fingerprint sensor, LEDs, an electronic or mechanical button.

Figure 5A:
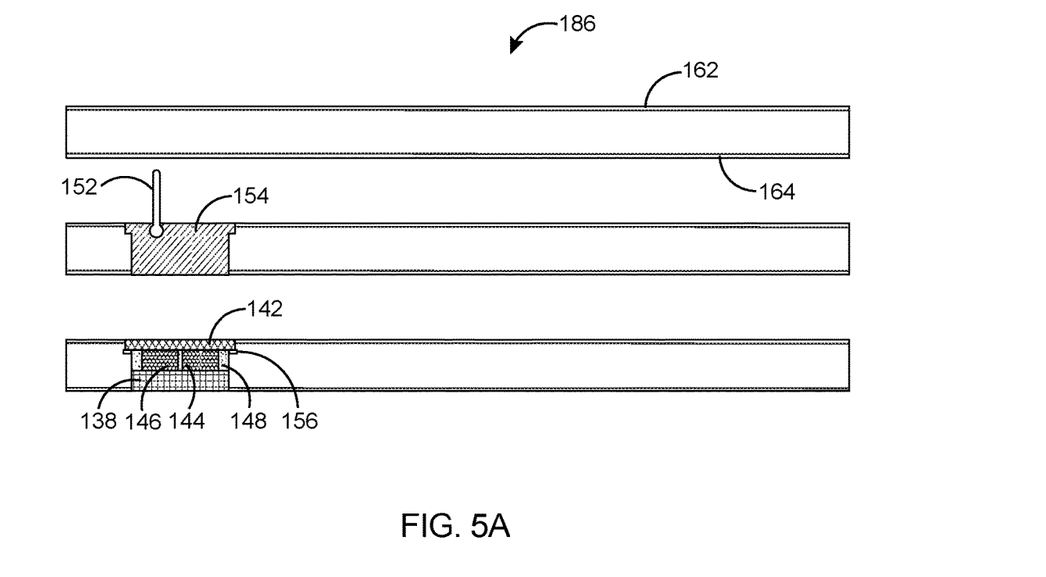
FIG. 5A is a schematic diagram showing an embedding of the fourth assembly shown in FIG. 5 according to the present invention.

FIG. 5A is a schematic diagram showing an embedding of the fourth assembly shown in FIG. 5 according to the present invention. The method of fabrication of a value-add smart card 100 (shown in FIG. 1) comprising the step of embedding the fourth assembly 180, by milling the card from the front and embedding the top half portion of the module from the front of the card, the bottom half portion from the back of the card and connecting both halves to assemble a full module. The milled area 154 should conform to the shape of the packaged electronic module 180.

Figure 6:
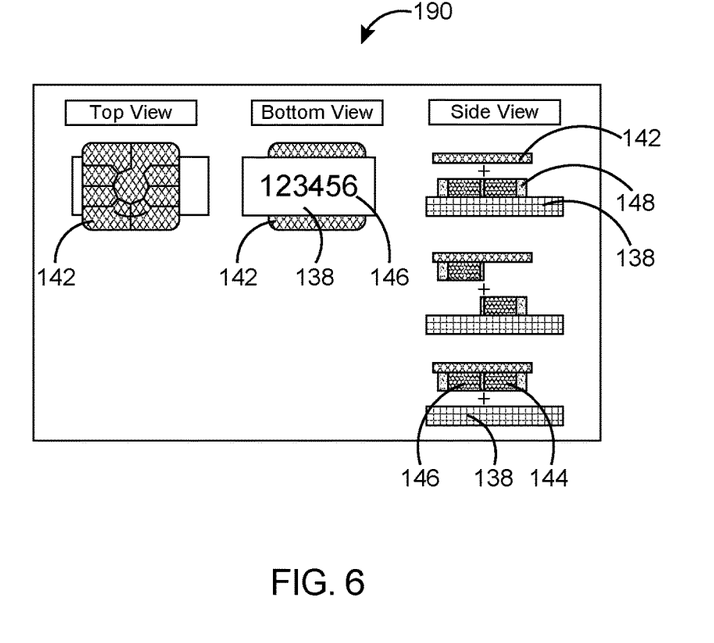
FIG. 6 represents a fifth assembly of a packaged electronic module in accordance with the preferred embodiment of the present invention.

FIG. 6 represents a fifth assembly of a packaged electronic module in accordance with the preferred embodiment of the present invention. The fifth assembly 190 comprises a two-part assembly where the footprint of the all electronics is larger than that of the contact plate 142. The fifth assembly of a packaged electronic module 190 comprises the plurality of electronic component 146 connected to the contact plate 142 and the integrated circuit chip 144, the electronic display 138 connected to the plurality of electronic components 146 and the plurality of connectors (not shown) that may connect the packaged electronic module 190 to the card antenna 110 (shown in FIG. 1) or an embedded battery (not shown). The thickness of the packaged electronic module 190 may be equal to but not larger than that of the plastic card. The fifth assembly 190 may be further defined as an assembly of the top half portion and the bottom half portion of the packaged electronic module. The fifth assembly 190 wherein the bottom half portion is larger than the top half portion of the packaged electronic module, wherein the top half portion and the bottom half portion is assembled into an asymmetric packaged electronic module to avoid that some electronic components 146 would be too close to the card's border. The packaged electronic module 190 may have a micro-antenna to connect to an antenna in the card using inductive coupling. The electronic display 138 may be a value-add component, such as a fingerprint sensor, LEDs, an electronic or mechanical button.

Figure 6A:
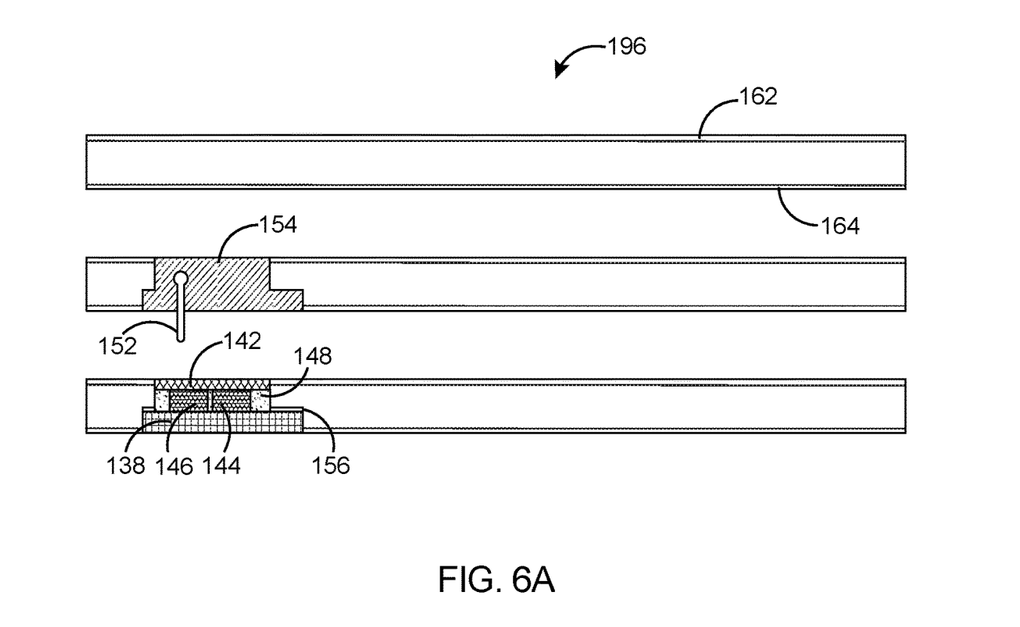
FIG. 6A is a schematic diagram showing an embedding of the fifth assembly shown in FIG. 6 according to the present invention.

FIG. 6A is a schematic diagram showing an embedding of the fifth assembly shown in FIG. 6 according to the present invention. The method of fabrication of a value-add smart card 100 (shown in FIG. 1) comprising the step of embedding the fifth assembly 190, by milling the card from the back of the card all the way through the front of the card and embedding the top half portion of the module from the front of the card, the bottom half portion from the back of the card and connecting both halves to assemble a full module. The milled area 154 should conform to the shape of the packaged electronic module 190

The packaged electronic module 120 (shown in FIG. 1) is used to manufacture value-add smart cards 100 (shown in FIG. 1) with embedded electronics. The value-add smart card may be contactless-only, contact-only, or may be dual-interface (contact and contactless). This invention packages the electronic-components 146 usually found on a Flexible Printed Circuit (FPC), together with the integrated circuit chip 144 and the contact plate 142, into a module. This module can then be embedded into a plastic card by a card manufacturer, using regular milling techniques. Depending on the relative size of the electronic components and the contact plate, different assemblies are possible. This invention has less risk of damaging the electronic components since there is no hot or cold lamination involved. This invention enables all existing card manufacturers to manufacture these value-add smart cards with embedded electronics.

As will be appreciated by one skilled in the art, a software embodiment may include firmware, resident software, micro-code, etc. Certain components including software or hardware or combining software and hardware aspects may generally be referred to herein as a "circuit," "module" or "system." Furthermore, the subject matter disclosed may be implemented as a computer program product embodied in one or more computer readable storage medium(s) having computer readable program code embodied thereon. Any combination of one or more computer readable storage medium(s) may be utilized. The computer readable storage medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing.

In the context of this document, a computer readable storage medium may be any tangible medium that may contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that may communicate, propagate, or transport a program for use by or in connection with an instruction execution system, apparatus, or device.

Program code embodied on a computer readable storage medium may be transmitted using any appropriate medium, including but not limited to wireless, wire line, optical fiber cable, RF, etc., or any suitable combination of the foregoing. Computer program code for carrying out the disclosed operations may be written in any combination of one or more programming languages, including an object oriented programming language such as Java, Smalltalk, C++ or the like and conventional procedural programming languages, such as the "C" programming language or similar programming languages.

The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The foregoing description of the preferred embodiment of the present invention has been presented for the purpose of illustration and description. It is not intended to be exhaustive or to limit the invention to the precise form disclosed. Many modifications and variations are possible in light of the above teachings. It is intended that the scope of the present invention not be limited by this detailed description, but by the claims and the equivalents to the claims appended hereto.

What is claimed is:

1. An all-in-one assembly of a packaged electronic module for use with a card, comprising:
   a) an integrated circuit chip;
   b) a plurality of electronic components connected to the integrated circuit chip; and
   c) an electronic display connected to the plurality of electronics components;
   wherein at least one portion of the packaged electronic module is embedded into the card from the front and at least a second portion of the packaged electronic module is embedded into the card from the back, and the portions are connected to form a value-add smart card.

2. The all-in-one assembly of claim 1, wherein the packaged electronic module has a thickness substantially equal to that of the card.

3. The all-in-one assembly of claim 1, further comprising a contact plate connected to the integrated circuit chip.

4. The all-in-one assembly of claim 1 wherein the display is embedded into the card from the back to form a value-add smart card.

5. The all-in-one assembly of claim 1 wherein the packaged electronic module is connected to one or more card antennas within the card.

6. The all-in-one assembly of claim 1 wherein the packaged electronic module is connected to an embedded battery within the card.

7. The all-in-one assembly of claim 1, wherein the electronic display or contact plate of a packaged electronic module is replaced by at least one value-add component, selected from the group; a fingerprint sensor; LEDs, an electronic button and a mechanical button.

8. An all-in-one assembly of a packaged electronic module, comprising:
   a) an integrated circuit chip;
   b) a plurality of electronics components connected to the integrated circuit chip; and c) an electronic display connected to the plurality of electronics components;

wherein the packaged electronic module is embedded into a card from the back to form a value-add smart card.

9. The all-in-one assembly of claim 8, wherein the packaged electronic module has a thickness substantially equal to that of the card.

10. The all-in-one assembly of claim 8, further comprising a contact plate connected to the integrated circuit chip.

11. The all-in-one assembly of claim 10 further defined as an assembly of the plurality of electronics components with the module having an asymmetric shape.

12. The all-in-one assembly of claim 8 wherein the packaged electronic module is connected to at least one card antenna within the card.

13. The all-in-one assembly of claim 8 wherein the packaged electronic module is connected to an embedded battery within the card.

14. The all-in-one assembly of claim 8, wherein the electronic display or the contact plate of a packaged electronic module is replaced by at least one value-add component selected from the group; a fingerprint sensor, LEDs, an electronic button and a mechanical button.

15. A two-part assembly of a packaged electronic module, comprising:
   a) a plurality of electronics components being assembled into a top portion of the packaged electronic module; and
   b) an electronic display connected to the plurality of electronics components and being assembled into a bottom portion of the packaged electronic module;
   wherein the top portion and the bottom portion of the packaged electronic module are embedded into card by embedding the top portion of the module from the front of the card, the bottom portion from the back of the card and connecting both portions to assemble a full module and form a value-add smart card.

16. The two-part assembly of a packaged electronic module of claim 15, wherein the bottom portion is larger than the top portion of the packaged electronic module.

17. The two-part assembly of a packaged electronic module of claim 15, further comprising a contact plate configured with the plurality of electronics.

18. The two-part assembly of a packaged electronic module of claim 17, wherein footprint of the plurality of electronics components is not larger than the footprint of the contact plate.

19. The two-part assembly of a packaged electronic module of claim 17, wherein the top portion and the bottom portion is assembled into an asymmetric packaged electronic module.

20. The all-in-one assembly of claim 17, wherein the electronic display or the contact plate of a packaged electronic module is replaced by at least one value-add component selected from the group; a fingerprint sensor, LEDs, an electronic button and a mechanical button.

21. The two-part assembly of a packaged electronic module of claim 15, wherein the full module is connected to at least one card antenna within the card or an embedded battery.

22. A computer program product comprising computer executable instructions embodied in a non-transitory computer readable storage medium having a computer readable program code embodied therein, the computer readable program code configured to be executed on a computer system to implement a method for fabricating a packaged electronic module for a smart card, the method comprising the steps of:
   a) providing a card body, a plurality of connectors, a plurality of electronics components, a card antenna, and an integrated circuit module comprising an integrated circuit chip and a contact plate;
   b) inserting the integrated circuit chip to the contact plate;
   c) bonding the plurality of connectors with the contact plate;
   d) forming the electronic module by packaging the plurality of electronics components therewith;
   e) milling the card body from the front of the card body through the back of the card body, or from the front of the card body to the back protective overlay and leaving the protective overlay intact;
   f) embedding the packaged electronic module from the front of the card body; and
   g) connecting the card antenna within the card to the plurality of connectors;
   wherein the milled area substantially conforms to the shape of the packaged electronic module.

23. A computer program product comprising computer executable instructions embodied in a non-transitory computer readable storage medium having a computer readable program code embodied therein, the computer readable program code configured to be executed on a computer system to implement a method for fabricating a packaged electronic module for a smart card, the method comprising the steps of:
   a) providing a card body, a plurality of connectors, a plurality of electronics components, a display, and an integrated circuit module comprising an integrated circuit chip and a contact plate;
   b) inserting the integrated circuit chip to the contact plate;
   c) bonding the plurality of connector with the contact plate;
   d) forming a top portion of the electronic module by packaging the plurality of electronics components therewith;
   e) milling the card body from the back through the front, or from the front through the back;
   f) embedding the top portion of the electronic module from the front of the card and the display from the back of the card; and
   g) connecting the top portion of the electronics module and the display to assemble a full module and form a value-add smart card.

* * * * *